(12) United States Patent
Zhang et al.

(10) Patent No.: US 9,760,132 B2
(45) Date of Patent: Sep. 12, 2017

(54) STIFFENING ELECTRONIC PACKAGES BY DISPOSING A STIFFENER RING BETWEEN SUBSTRATE CENTER AREA AND CONDUCTIVE PAD

(71) Applicant: Nvidia Corporation, Santa Clara, CA (US)

(72) Inventors: Leilei Zhang, Sunnyvale, CA (US); Ron Boja, Gilroy, CA (US); Abraham Yee, Cupertino, CA (US); Zuhair Bokharey, Fremont, CA (US)

(73) Assignee: Nvidia Corporation, Santa Clara, CA (US)

( * ) Notice: Subject to any disclaimer, the term of this patent is extended or adjusted under 35 U.S.C. 154(b) by 575 days.

(21) Appl. No.: 14/031,714

(22) Filed: Sep. 19, 2013

(65) Prior Publication Data

US 2015/0077918 A1    Mar. 19, 2015

(51) Int. Cl.
*H01L 23/16* (2006.01)
*G06F 1/18* (2006.01)
(Continued)

(52) U.S. Cl.
CPC .............. *G06F 1/183* (2013.01); *H01L 23/16* (2013.01); *H01L 23/49827* (2013.01);
(Continued)

(58) Field of Classification Search
CPC .... H05K 1/144; H05K 1/0298; H05K 1/0271; H05K 2201/2009; H05K 3/30; H05K 2201/10515; H05K 1/14; H05K 1/02; G06F 1/183; Y10T 29/4913; H01L 23/16; H01L 23/49827; H01L 23/49811; H01L 23/49816; H01L 23/49833; H01L 24/73; H01L 25/105; H01L 25/50; H01L 2224/32145; H01L 2224/48229; H01L 2224/16227; H01L 2225/06562; H01L 2924/3511; H01L 2924/15331; H01L 2924/1434; H01L 2924/1431; H01L 2924/00014; H01L 2225/1023; H01L 2225/0651; H01L 2224/73265;
(Continued)

(56) References Cited

U.S. PATENT DOCUMENTS

| | | | | |
|---|---|---|---|---|
| 5,545,850 A | * | 8/1996 | Mahulikar | H01L 23/16 |
| | | | | 174/529 |
| 5,841,194 A | * | 11/1998 | Tsukamoto | H01L 23/145 |
| | | | | 257/668 |
| 6,936,499 B2 | * | 8/2005 | Shibata | B05B 15/1218 |
| | | | | 257/E23.135 |

(Continued)

*Primary Examiner* — Scott B Geyer

(57) ABSTRACT

Stiffening is provided for an electronic package assembly having a substrate. A first electronic package, having a first function, is electromechanically fastened to a first surface of the substrate with a first array of electrically conductive interconnects, which is disposed over a central area of the substrate first surface. A second electronic package, having a second function, is fastened to the first substrate surface with a second conductive interconnect array. At least a pair of the first array conductors is electrically coupled to at least a pair of the second array conductors for data/signal exchange and at least a component of the first electronic package interacts with at least a component of the second package. A metallic stiffener ring is disposed about an outer periphery of at least the central area of the substrate.

30 Claims, 4 Drawing Sheets

Example Assembled PoP Assembly. 300

(51) Int. Cl.
*H01L 25/10* (2006.01)
*H01L 25/00* (2006.01)
*H05K 1/02* (2006.01)
*H01L 23/498* (2006.01)
*H01L 23/00* (2006.01)

(52) U.S. Cl.
CPC ............ *H01L 25/105* (2013.01); *H01L 25/50* (2013.01); *H01L 23/49811* (2013.01); *H01L 23/49816* (2013.01); *H01L 23/49833* (2013.01); *H01L 24/73* (2013.01); *H01L 2224/16227* (2013.01); *H01L 2224/26175* (2013.01); *H01L 2224/32145* (2013.01); *H01L 2224/32225* (2013.01); *H01L 2224/48229* (2013.01); *H01L 2224/73204* (2013.01); *H01L 2224/73265* (2013.01); *H01L 2225/0651* (2013.01); *H01L 2225/06562* (2013.01); *H01L 2225/1023* (2013.01); *H01L 2225/1058* (2013.01); *H01L 2924/00014* (2013.01); *H01L 2924/1431* (2013.01); *H01L 2924/1434* (2013.01); *H01L 2924/15331* (2013.01); *H01L 2924/3511* (2013.01); *H05K 1/0271* (2013.01); *H05K 2201/2009* (2013.01); *Y10T 29/4913* (2015.01)

(58) Field of Classification Search
CPC . H01L 2224/73204; H01L 2224/32225; H01L 2224/26175; H01L 2224/48227; H01L 2924/00012; H01L 2224/16225; H01L 2924/00; H01L 2224/13099
See application file for complete search history.

(56) References Cited

U.S. PATENT DOCUMENTS

| | | | |
|---|---|---|---|
| 7,211,889 B2* | 5/2007 | Shim | ............... H01L 23/10 257/707 |
| 7,352,071 B2* | 4/2008 | Yee | ............... H01L 21/565 257/795 |
| 7,781,682 B2 | 8/2010 | Bahadur et al. | |
| 2002/0060084 A1* | 5/2002 | Hilton | ............... H01L 21/563 174/523 |
| 2004/0090756 A1 | 5/2004 | Ho et al. | |
| 2004/0212970 A1 | 10/2004 | Chen et al. | |
| 2005/0224953 A1 | 10/2005 | Lee et al. | |
| 2008/0284047 A1* | 11/2008 | Tosaya | ............... H01L 23/053 257/787 |
| 2010/0001410 A1 | 1/2010 | Kang | |
| 2011/0147919 A1 | 6/2011 | Sutardja | |
| 2012/0187583 A1* | 7/2012 | Karpur | ............... H01L 21/563 257/787 |
| 2013/0270721 A1 | 10/2013 | Chiriac et al. | |

* cited by examiner

STIFFENING ELECTRONIC PACKAGES BY DISPOSING A STIFFENER RING BETWEEN SUBSTRATE CENTER AREA AND CONDUCTIVE PAD

Embodiments of the present invention relate to electronic packaging. More particularly, an example embodiment of the present invention relates to stiffening an electronic package.

BACKGROUND

Miniaturization of modern components, such as the integrated circuits (IC) and other electronic components from which they are assembled, is helpful in reducing the size of mobile devices. Further size reduction may be achieved by efficient electrical and mechanical (e.g., electromechanical) packaging of the electronic components from which the mobile devices are assembled. Modern electronic packaging techniques, such as stacked-die packaging, package-in-packages (PiP) and stacked-packaging, thus increase the density of components in mobile device assembly.

To conserve planar space on a mutual motherboard, discrete interacting IC components of a mobile device such as logic and memory may be stacked, e.g., installed vertically in relation to each other, using a package-on-package (PoP) technique. In a typical PoP mixed logic-memory stack, a central processing unit (CPU) or other processor package may be electro-mechanically mounted (electrically coupled and mechanically fastened) to a printed circuit board (PCB) using a ball-grid array (BGA) or other conductors. The memory package may be disposed over the CPU package.

The memory package is electro-mechanically mounted to the CPU package using a BGA. The CPU package and the memory package each comprise an electrically insulating laminate substrate, which is disposed over an upper surface of their respective BGAs. A logic die is disposed within the substrate of the CPU package and a memory die is disposed within the memory package substrate. As memory uses fewer input/output (I/O) resources than logic, the connection pitch (e.g., density; solder ball count) of electrical interconnects for a logic package typically exceeds the connection pitch of electrical interconnects for a memory package.

In another PoP, a CPU package is disposed over a memory package using a single laminate substrate base on which two BGAs are disposed. A BGA with a fine ball pitch may be disposed over a first substantially rectangular area, which occupies a substantially central area of the base. A second BGA with coarse pitch, in relation to the fine ball pitch of the first BGA, is disposed over a pad. The pad comprises a recess disposed within a second substantially rectangular area of the base, which essentially surrounds an outer boundary of the first central area and BGA.

PoPs are typically thin, which allow their use in small (e.g., thin) mobile devices. The discrete CPU and random access memory (RAM) component packages from which the PoPs are assembled, are thus also quite thin. However, it may be difficult to maintain the flatness and/or prevent flexing and damage to such thin PoPs and their component packages during and following assembly. One stiffening approach to address this issue uses plastic, polymeric or ceramic stiffener rings. However, stiffeners are useless or inapplicable in some PoPs and may lack sufficient strength and/or stiffness to control warping or flexing, or to prevent related damage to the PoP assembly or its components during fabrication, installation or operation. Where used, stiffener rings also demand space, typically including an exclusionary zone adjacent or proximate to its periphery, which reduces available operational "real estate" on the PoP.

Further, PoP assemblies may have an electrically insulating polymeric matrix between the upper RAM component and the lower CPU component for support, and to encapsulate and insulate the first (e.g., fine pitch, central) electrical interconnections. Before the polymeric under-fill material fully sets during assembly of a PoP, it may tend to flow. An over flow of the under-fill polymer insulation however may contaminate the outer pad. Contamination of the outer pad can reduce the electrical integrity of the second BGA disposed therein.

One approach to address this issue is to add an insulating material as a dam, to block the overflow of under-fill material from encroaching on the dam area. However, this requires several extra process steps, which complicate package fabrication. For example, a first additional process step is needed to add the dam material and, after the under-fill material sets, a second process step is needed to remove the dam material. Unfortunately, the polymeric dam has an insufficient modulus of stiffness to function as a stiffener. Moreover, the second additional removal process step is also needed to address issues related to one or more electrical, chemical, thermal, mechanical or other properties of the dam material.

Approaches described in this Background section could, but have not necessarily been conceived or pursued previously. Unless otherwise indicated, neither approaches described in this section, nor issues identified in relation thereto, are to be assumed as recognized in any prior art merely by the discussion thereof within this section.

SUMMARY

It would be useful to maintain the flatness of a Package-on-Package (PoP) electronic stack and its component packages during and following assembly, which can prevent, deter or minimize flexing and possible damage related thereto. While maintaining its flatness during assembly of the PoP, it would also be useful to prevent overflow of polymeric electrically insulating under-fill material from beneath an upper component package thereof and reduction in electrical effectiveness of its conductive interconnects related thereto. Further, it would be useful to achieve such utility and to assemble PoP products and component packages thereof without increasing the complexity, cost, or failure rate of their production.

Example embodiments of the present invention relate to stiffening an electronic package. An electronic package assembly has a first package with a first function (e.g., logic) and a second package with a second function (e.g., memory), each fastened electromechanically to a substrate with an individual array of electrically conductive interconnects. A first interconnect array is disposed over a central area of a first (e.g., upper) surface of the substrate to couple the first package. The substrate may comprise an electrically insulating material.

A conductive pad is disposed about a periphery of the substrate central area and a second interconnect array is electrically coupled thereto for the second package. At least a pair of the first conductors is electrically coupled to at least a pair of the second conductors for the exchange of data and/or signals, with which at least a component of the first package interacts electronically with at least a component of the second package. A metallic stiffener ring is disposed about the outer periphery of at least the central area of the substrate; for example, between the central substrate area and the conductive pad. The metallic stiffener ring may comprise one or more metal substances (e.g., copper, etc.). Two or more of the metal substances may be combined chemically and metallurgically as an alloy. The ring has sufficient stiffness and tensile and torsional strength to control or deter warping or flexing of the package assembly or its electronic components, which helps prevent damage during fabrication, installation and operation.

In an example embodiment, the package assembly also has an electrically insulating under-fill matrix disposed above the substrate upper surface and beneath at least the first electronic component. The under-fill matrix encapsulates the first set of interconnects. A significant portion of the stiffener ring extends above the plane of the first surface of the substrate. Prior to a solidifying set-up of the under-fill matrix, the stiffener ring portion above the substrate surface dams a flow of the unsolidified under-fill material from an area of the first surface of the substrate in which the second set of interconnects is disposed. Thus, the stiffener ring deters contamination of the conductive pad area by misplaced under-fill material and related electrical conduction inadequacies. In another example embodiment, the metallic stiffener ring is disposed about a periphery of the substrate.

An example embodiment may be implemented in which substrate comprises a base, which is disposed over a second (e.g., lower) surface of the substrate opposite from the first (e.g., upper) surface thereof. The electronic package assembly may have a package on package (PoP) configuration. The PoP may be mounted on a printed circuit board (PCB) or the like or fastened thereto electromechanically. Some or all of the interconnects in the first and/or second array may be coupled electrically to conductors of the PCB, such as vertical interconnect accesses (vias) and traces for the exchange of data and signals.

Example embodiments of the present invention described herein also relate to methods for packaging an assembly of electronic devices and to an electronic packaging product such as a PoP which is fabricated or assembled by such processes.

Thus, an example embodiment of the present invention relates to stiffening an electronic package. An example embodiment maintains the flatness of a PoP electronic stack and its component packages during and following assembly, and thus prevents, deters or minimizes flexing and possible damage related thereto. While maintaining its flatness during assembly of the PoP, an example embodiment also prevents overflow of polymeric electrically insulating under-fill material from beneath an upper component package thereof and reduction in electrical effectiveness of its conductive interconnects related thereto. Further, an example embodiment thus stiffens electronic packages and assembles flat PoP products and component packages thereof without increasing the complexity, cost, or failure rate of their production.

BRIEF DESCRIPTION OF THE DRAWINGS

The accompanying drawings described in this section comprise a part of the specification herein of example embodiments of the present invention and are used for explaining features, elements and attributes thereof. Principles of example embodiments are described herein in relation to each figure of these drawings, in which like numbers are used to reference like items, and in which.

DESCRIPTION OF EXAMPLE EMBODIMENTS

Overview, Notation and Nomenclature

Figure 1A:
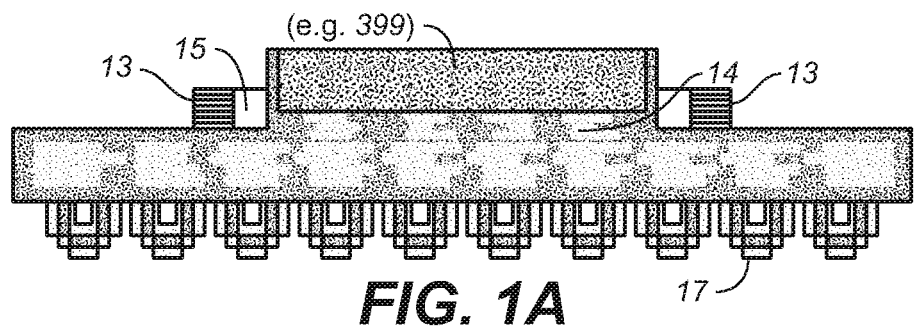
FIG. 1A and FIG. 1B depict an example PoP configuration, according to an embodiment of the present invention.

An embodiment of the present invention relates to stiffening an electronic package. Stiffening is provided for an electronic package assembly having a substrate. A first electronic package, having a first function, is electromechanically fastened to a first surface of the substrate with a first array of electrically conductive interconnects, which is disposed over a central area of the first surface of the substrate. A second electronic package, having a second function, is fastened to the first surface of the substrate with a second conductive interconnect array. At least a pair of the first array conductors is electrically coupled to at least a pair of the second array conductors for data/signal exchange and at least a component of the first electronic package interacts with at least a component of the second package. A metallic stiffener ring is disposed about an outer periphery of at least the central area of the substrate.

Reference will now be made in detail to implementations of the example embodiments as illustrated in the accompanying drawings. The same reference numbers will be used to the extent possible throughout the drawings and the following description to refer to the same or like items. It will be apparent to artisans of ordinary skill in technologies that relate to semiconductors however, that example embodiments of the present invention may be practiced without some of these specifically described details. Example embodiments of the present invention are described in relation to stiffening an electronic package.

For focus, clarity and brevity, as well as to avoid unnecessarily occluding, obscuring, obstructing or obfuscating features that may be somewhat more germane to, or significant in explaining example embodiments of the present invention, this description may avoid discussing some well-known processes, structures, components and devices in exhaustive detail. Artisans of ordinarily skilled in semiconductor related technologies should realize that the following description is made for purposes of explanation and illustration and is not intended to be limiting in any way. On the contrary; other embodiments should readily suggest themselves to artisans of such skill in relation to the example features and elements described herein and any corresponding benefits such embodiments may achieve.

Used in relation to interconnects, coupling, connecting, fastening and mounting herein, the term "electromechanical" may refer to a sound (e.g., sufficiently strong) mechanical bond that is effective as an electrical conductor and coupler. As used herein, the nouns "periphery," "perimeter," "circumference" and "boundary" may be interchanged or used as synonyms for each other. Likewise, the verbs "circumscribe," "envelope," "enclose" and "surround" may be interchanged herein or used as synonyms for each other.

An example embodiment of the present invention is described in relation to stiffening an electronic package. While embodiments are described herein with reference to example package-on-package (PoP) electronic assemblies, it should be appreciated that this is by way of illustration, example, clarity, brevity and simplicity of description. Moreover, artisans of ordinary skill in electronic packaging technologies should realize, appreciate and understand that the scope of embodiments of the present invention is broader than the examples described herein. For example, skilled artisans in these fields should realize that the scope covers electronic packaging and products having multiple discrete semiconductor components with stacked and other configurations in addition to PoPs.

Example Package-on-Package Configurations, Assemblies and Products

Figure 1B:
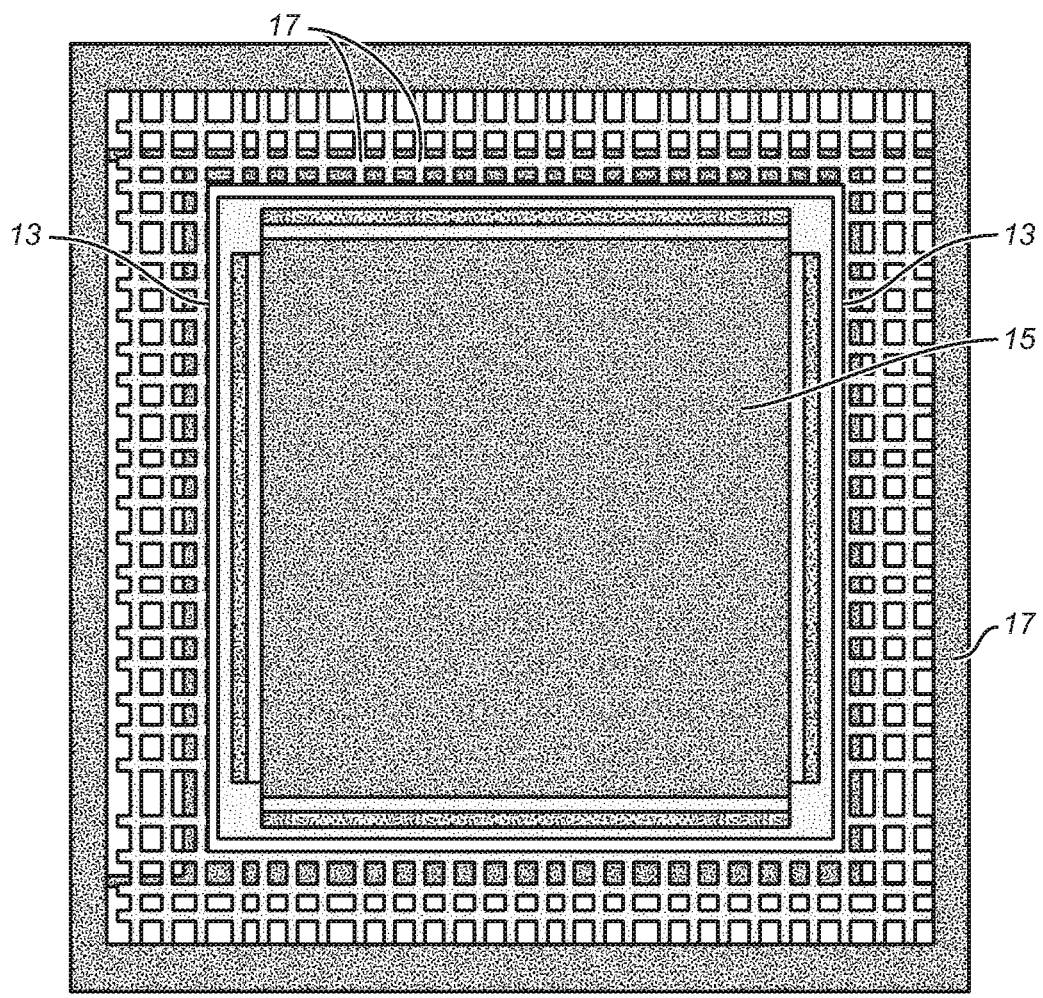

Embodiments of the present invention relate to stiffening an electronic package. FIG. 1A and FIG. 1B depict respectively a side view and a top view of an example package-on-package (PoP) configuration 10, in accordance with an embodiment of the present invention. PoP electronic packaging product, or a component or structure thereof, may be assembled according to the PoP configuration 10. PoP 10 has an electrically insulating laminar substrate 11 disposed over a base 19, which may support electro-mechanical interconnection to a printed circuit board (PCB) or the like.

An example embodiment may be implemented in which a conductive pad 12 is disposed over a substantially rectangular periphery region circumscribing, enclosing or surrounding a substantially rectangular central area 15 of the substrate 11. A first array of conductive interconnects 17 are electrically coupled to the conductive pad 12. FIG. 1B may be considered to extend beyond the dashed lines shown at the top of the figure to include at least an additional upper horizontal row of four (4) interconnects 17 (e.g., substantially as shown in the horizontal row thereof at the bottom of the figure but opposite thereto).

Figure 3:
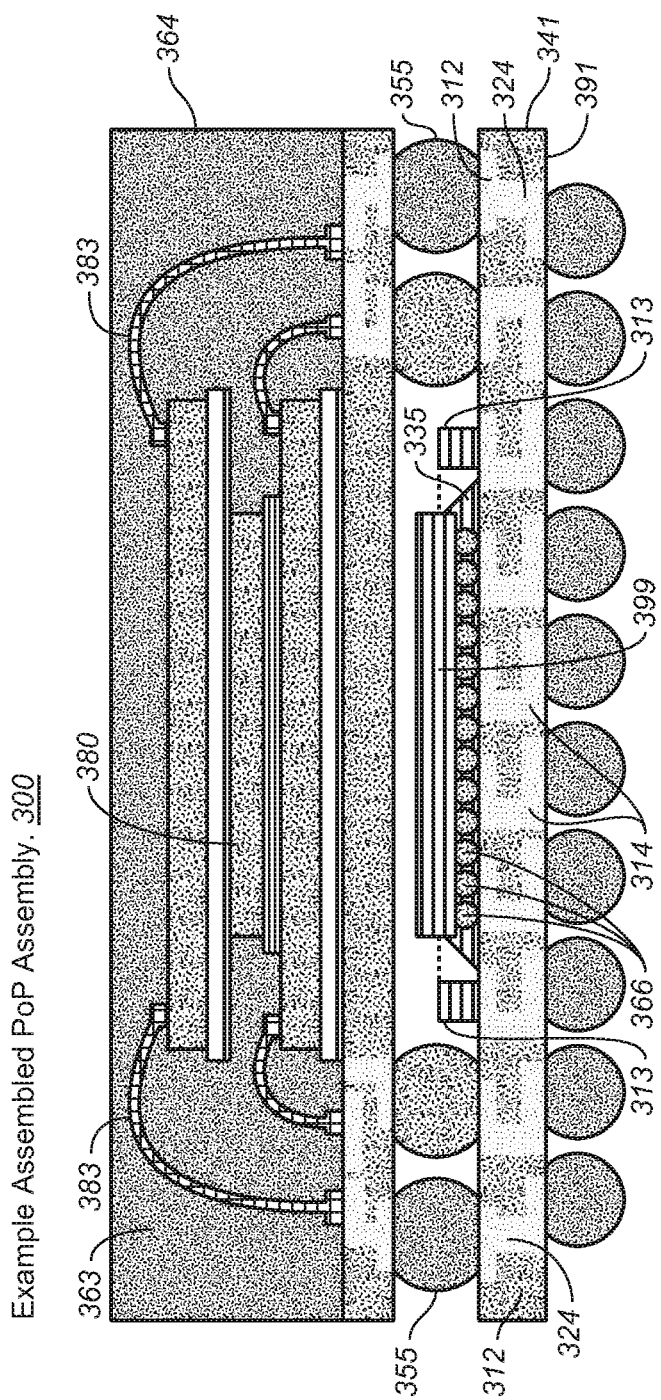
FIG. 3 depicts an example PoP assembly, according to an embodiment of the present invention.

A second array of conductive interconnects 14 are disposed in a substantially rectangular arrangement over the central area 15. The first array of interconnects 17 may have a coarser pitch than the second array of interconnects 14. The first interconnect array 17 may provide an electro-mechanical connection for a BGA, solder ball/bump grid or the like to fasten and electrically couple a memory package (e.g., memory package 388; FIG. 3) to the PoP 10. The second interconnect array 14 may provide an electro-mechanical connection for a BGA, solder ball/bump grid or the like to fasten and electrically couple a logic package (e.g., CPU package 399; FIG. 3) to the PoP 10.

One or more of interconnects 17 may be electrically coupled to one or more of interconnects 14. Thus, the PoP 10 may support a memory package and a logic package, which may interact electrically together for the exchange of signals and data. The base 19 allows one or more of interconnects 17 and/or one or more of interconnects 14 to couple electrically for the exchange of signals and data with external conductors, disposed for example as traces and vertical interconnect accesses (vias) on a PCB to which the PoP 10 may be electro-mechanically mounted.

A substantially rectangular metallic ring 13 is deposited (using e.g., a metal plating process) between the central area 15 and the pad 12. As used herein, the term 'ring' may refer to any geometry. The metallic ring comprises an alloy and/or one or more component metal substances, such as copper (Cu), tungsten, titanium, vanadium, chromium, aluminum, precious metals (e.g., gold, silver, platinum), rare earth metals (e.g., lanthanide series elements) or the like. The metallic ring 13 substantially encloses, circumscribes or surrounds the central area 15 and may be positioned between at least two (2) opposing sides of the pad 12 and the array of interconnects 17.

In an example embodiment of the present invention, the metallic ring 13 has a sufficient stiffness modulus to provide mechanical rigidity, strength and stability to the PoP 10. The metallic ring 13 thus stiffens and strengthens the PoP 10. The stiffening/strengthening deters or prevents warpage or flexing of PoP configuration 10 or its components, which may result from torsional, lateral and/or angular stress, shock or vibration during assembly or operation.

The stiffener ring 13 requires no significant keep-out zone and may be sized according to space available in the PoP 10. The metallic stiffener ring 13 has sufficient thickness to effectively stabilize the PoP 10, even with ring dimensions significantly below 1.25 mm (millimeters), e.g., the substantial width or thickness of typical conventional polymeric stiffener rings or dams (based on contemporary process limitations and not including the significant extra real estate demanded over the surface of a substrate for associated keep-out zones on both sides).

Moreover, a substantial portion of the metallic stiffener ring 13 extends above an upper surface of substrate 11. In en example embodiment of the present invention, the portion of stiffener ring 13 extending above the substrate 11 functions as a dam for subsequent installation of the logic package on the PoP 10 and an under-fill matrix material (e.g., under-fill matrix 335; FIG. 3) thereof.

FIG. 1B depicts PoP structure 10 generally and more particularly, the array of interconnects 17 disposed over the pad 12 and the central area 15 thereof, as conforming to a substantially rectangular contour. It should be appreciated however by artisans of ordinary skill in fields relating to electronics packaging that embodiments of the present invention may relate to packages of another contour, shape or outline. Further, an example embodiment may be implemented in which the PoP has a configuration different from that of PoP 10. For example, an embodiment may be implemented in which the copper stiffening ring circumscribes, encloses or surrounds all of the conductive interconnects, e.g., of more than one pitch, in a given PoP.

Figure 2A:
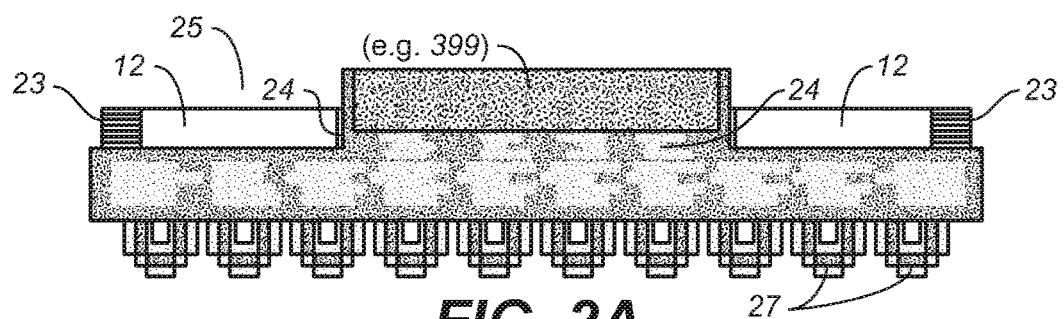
FIG. 2A and FIG. 2B depict an example PoP configuration, according to an embodiment of the present invention.
Figure 2B:
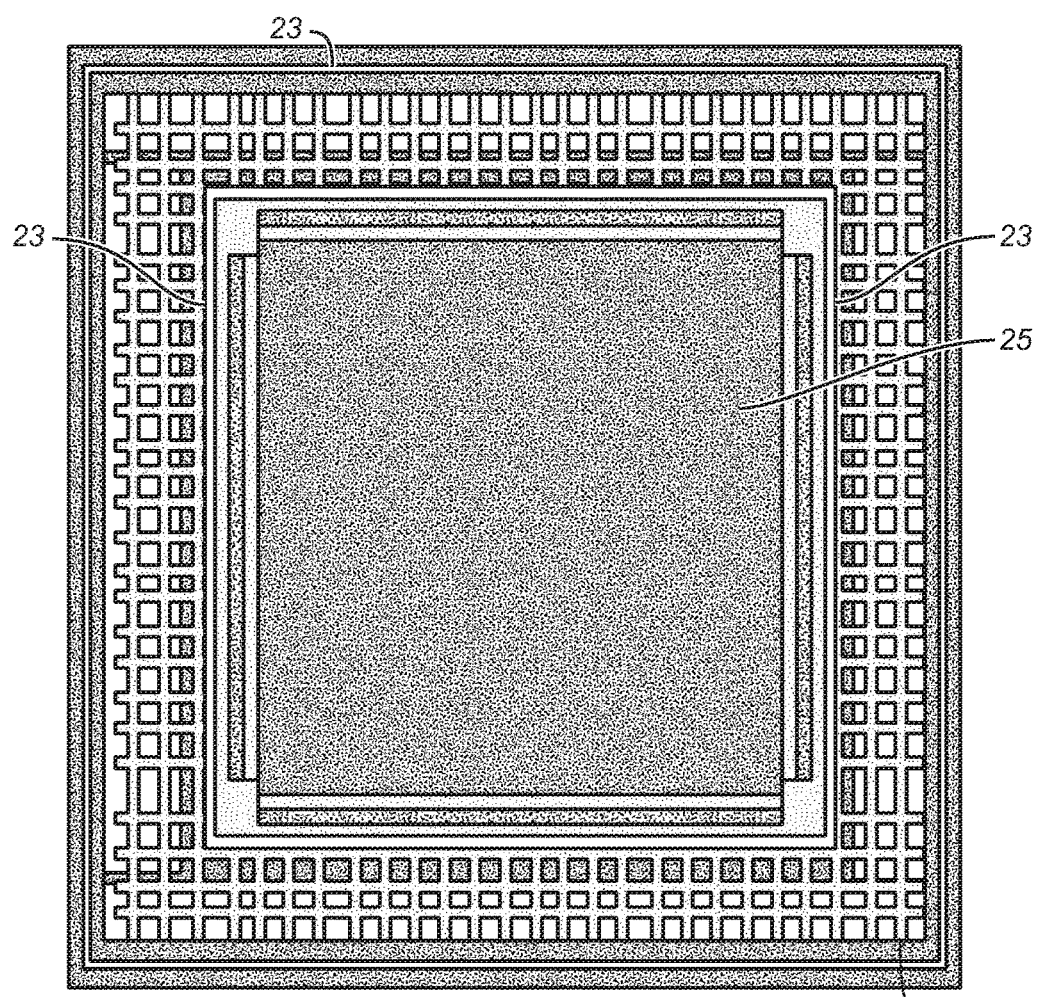

FIG. 2A and FIG. 2B depict respectively a side view and a top view of an example package-on-package (PoP) configuration 20, in accordance with an embodiment of the present invention. A PoP electronic packaging product, or a component or structure thereof, may be assembled according to the PoP configuration 20. PoP 20 has an electrically insulating laminar substrate 21 disposed over a base 29, which may support electro-mechanical interconnection to a PCB or the like.

An example embodiment may be implemented in which a conductive pad 22 is disposed over each of at least two opposite ends of a substantially rectangular central area 25 of the substrate 21. A first array of conductive interconnects 27 are electrically coupled to the conductive pad 22. A second array of conductive interconnects 24 are disposed in a substantially rectangular arrangement over the central area 25, between the each of the opposing conductive pads 22. The first array of interconnects 27 may have a coarser pitch than the second array of interconnects 24.

The first interconnect array 27 may provide an electro-mechanical connection for a BGA, solder ball/bump grid or the like to fasten and electrically couple a memory package (e.g., memory package 388; FIG. 3) to the PoP 20. The second interconnect array 24 may provide an electro-mechanical connection for a BGA, solder ball/bump grid or the like to fasten and electrically couple a logic package (e.g., CPU package 399; FIG. 3) to the PoP 20.

One or more of interconnects 27 may be electrically coupled to one or more of interconnects 24. Thus, the PoP 20 may support a memory package and a logic package, which may interact electrically together for the exchange of signals and data. The base 29 allows one or more of interconnects 27 and/or one or more of interconnects 24 to couple electrically for the exchange of signals and data with external conductors, disposed for example as traces and vias on a PCB to which the PoP 20 may be electro-mechanically mounted.

A substantially rectangular metallic (e.g., copper, etc.) ring 23 is deposited (using e.g., a plating process), circumscribing, surrounding or enclosing the central area 25, the pad 22 and both the first array 27 and second array 24 of electrical interconnects. In an example embodiment of the present invention, the metallic ring 23 has a sufficient stiffness modulus to provide mechanical rigidity and stability to the PoP 20. The metallic ring 23 thus stiffens and strengthens function to the PoP 20. The stiffening deters, controls or prevents warping or flexing thereof and related damage, which may result from torsional, lateral and/or angular stress, shock or vibration during assembly or operation.

The metallic stiffener ring 23 requires no significant keep-out zone and may be sized according to space available in the PoP 20. The metallic stiffener ring 23 has sufficient thickness to effectively stabilize the PoP 20, even with ring dimensions significantly below 1.25 mm.

Moreover, a substantial portion of the metallic stiffener ring 23 extends above an upper surface of substrate 21. In en example embodiment of the present invention, the portion of stiffener ring 23 extending above the substrate 21 may function as a dam for subsequent installation of one or more packages on the PoP 20 and any under-fill, insulating or binding matrix material (e.g., under-fill matrix 335; FIG. 3) thereof.

FIG. 2B depicts PoP structure 20 generally and more particularly, the first array of interconnects 27 disposed over the pad 22, the central area 25 thereof and the interconnects 24 disposed therewith, as conforming to a substantially rectangular contour. It should be appreciated however by artisans of ordinary skill in fields relating to electronics packaging that embodiments of the present invention may relate to packages of another contour, shape or outline. An example embodiment may be implemented in which one or more of PoP 20 or PoP 10 is assembled into an electronic package product.

FIG. 3 depicts an example PoP assembly 300, according to an embodiment of the present invention. A PoP electronic packaging product may be fabricated according to the PoP assembly 300. PoP assembly 300 has an electrically insulating laminar substrate 341 disposed over a base 391, which may support electro-mechanical interconnection of the assembly and electrically coupling its electronic components to conductors (e.g., vias, traces) of a PCB or the like.

An example embodiment may be implemented in which a conductive pad 312 is disposed over a periphery circumscribing, enclosing or surrounding, a central area (e.g., central area 15; FIG. 1) of the substrate 341. A first array of conductive interconnects 324 are electrically coupled to the conductive pad 312. A second array of conductive interconnects 314 are disposed over the central area. The first array of interconnects 324 has a coarser pitch than the second array of interconnects 314.

The first interconnect array 324 provides an electro-mechanical connection for a solder ball/bump grid, BGA or the like 355 to fasten and electrically couple a memory package 388 to the PoP assembly 300. The second interconnect array 314 provides an electro-mechanical connection for a solder ball/bump grid, BGA or the like 366 to fasten and electrically couple a CPU (e.g., logic) package 399 to the PoP assembly 300. The memory package 388 comprises a memory IC 380. The memory IC is coupled electrically to one or more of the solder balls 355 via wire bonds 383. The CPU IC 399 is coupled to one or more of the solder balls 366 via wire bonds 393.

One or more of interconnects 314 may be coupled electrically to one or more of interconnects 324. Thus, the PoP assembly 300 supports memory package 388 and CPU package 399 interacting electronically and/or electrically together for the exchange of signals and data. The base 319 allows one or more of interconnects 327 and/or one or more of interconnects 314 to couple electrically for the exchange of signals and data with external conductors, disposed for example as traces and vias on a PCB to which the PoP assembly 300 may be electro-mechanically mounted.

A metallic (e.g., copper, etc.) ring 313 is deposited (using e.g., a plating process), between the central area and the pad 312 (e.g., as described above with reference to FIG. 1B and FIG. 1A in relation to conductive pad 112). In an example embodiment of the present invention, the copper ring 313 has a sufficient stiffness modulus and strength to provide mechanical rigidity and stability to the PoP assembly 300. The copper ring 313 thus provides a stiffening and strengthening function to the PoP assembly 300, which deters or prevents flexing thereof, which may result from torsional, lateral and/or angular stress, shock or vibration during its fabrication or operation.

The metallic stiffener ring 313 requires no significant keep-out zone and may be sized according to space available in the PoP assembly 300. The metallic stiffener ring 313 has sufficient thickness to effectively stabilize the PoP assembly 300, even with ring dimensions significantly below 1.25 mm.

Moreover, a substantial portion of the copper stiffener ring 313 extends above an upper surface of substrate 311. In an example embodiment of the present invention, the portion of stiffener ring 313 extending above the substrate 311 functions as a dam for installation of the CPU package 399 on the PoP assembly 300 and an under-fill matrix material 335. Under-fill matrix 335 encapsulates and electrically insulates interconnects 314 and/or the conductive solder balls/bump grid or BGA 366 (and may help to mechanically fasten and/or thermally couple CPU package 399 to the PoP assembly 300).

From a top view, PoP assembly 300 generally and more particularly, the array of interconnects 324 disposed over the pad 312 and the array central area 15 thereof, may conform to a substantially rectangular contour (e.g., as described above with reference to FIG. 1B and FIG. 1A). It should be appreciated however by artisans of ordinary skill in fields relating to electronics packaging that embodiments of the present invention may relate to packages of another contour, shape or outline.

Further, an example embodiment may be implemented in which the PoP assembly has a configuration different from that of PoP 300 and depicted in FIG. 3. For example, an embodiment may be implemented in which the copper stiffening ring 313 circumscribes, encloses or surrounds all of the conductive interconnects (e.g., as described above with reference to FIG. 2B and FIG. 2A).

Upon fabricating PoP assembly 300, a subsequent, follow-on or backend process may add a protective plastic, ceramic or metallic cap 363 thereto to complete a PoP assembly product. The cap 363 may envelop or be filled with an electrically insulating and/or a thermally insulating or conductive filler material 364. The filler may comprise a gaseous (e.g., air, nitrogen, argon, etc.) or solid (e.g., polymeric, ceramic, glass, fiber, etc.) substance or mixture.

The PoP assembly 300 thus comprises at least two component packages (388, 399), which are each electro-mechanically coupled with one of at least two sets of interconnects (314, 324) and conductor components (355, 366) to a substrate (341). A metallic stiffener ring (313) provides torsional and lateral strength and stability, which controls warpage and prevents related damage to PoP assembly 300 and its components during fabrication, installation and operation. Thus, example embodiments of the present invention relate to stiffening an electronic package. Example embodiments also relate to methods for fabricating a PoP assembly and to a PoP product fabricated or assembled by such a process.

EXAMPLE PROCESS

Figure 4:
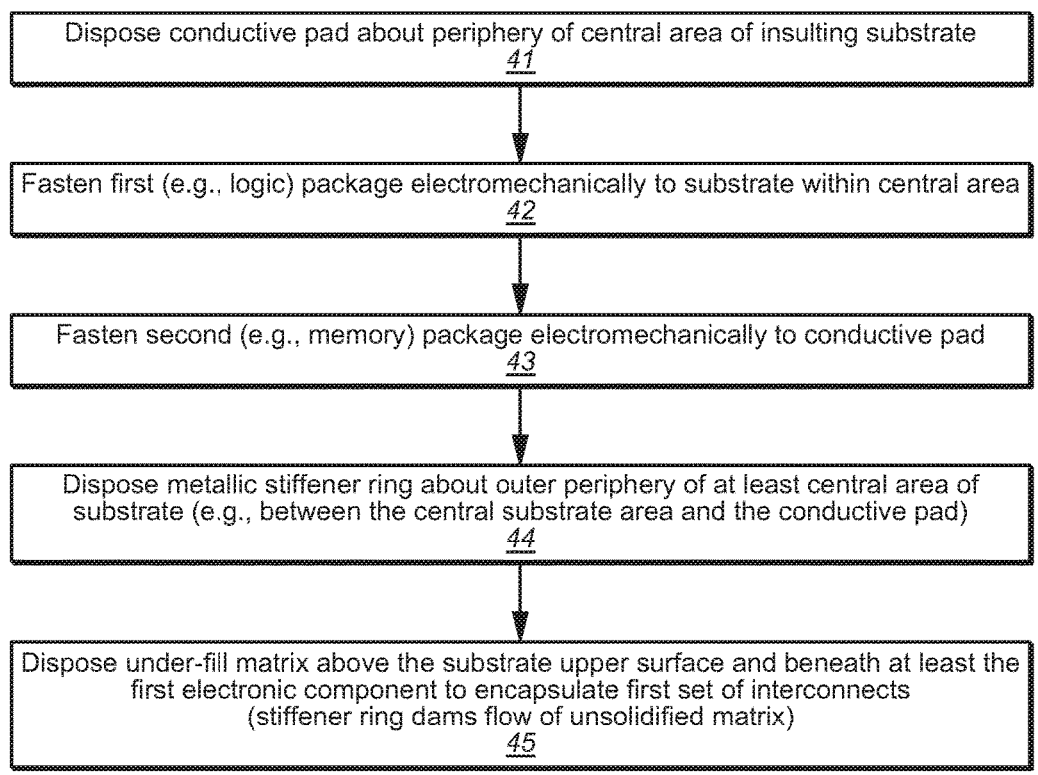
FIG. 4 depicts a flowchart of an example PoP assembly process, according to an embodiment of the present invention.

FIG. 4 depicts a flowchart of an example PoP assembly process 40, according to an embodiment of the present invention. In step 41, an electrically conductive pad is disposed about a periphery of a substantially central area of an electrically insulating substrate.

In step 42, a first package with a first function (e.g., logic) is fastened electromechanically to the substrate. In step 43, a second package with a second function (e.g., memory) is fastened electromechanically to the substrate. The first package and the second package are each fastened to the substrate with an individual array of electrically conductive interconnects.

A first interconnect array is disposed over the central area of a first (e.g., upper) surface of the substrate to couple the first package. A second interconnect array is electrically coupled to the conductive pad. At least a pair of the first conductors is electrically coupled to at least a pair of the second conductors for the exchange of data and/or signals, with which at least a component (e.g., CPU IC) of the first package interacts electronically with at least a component (e.g., memory IC) of the second package.

In step 44, a metallic stiffener ring is disposed about the outer periphery of at least the central area of the substrate; for example, between the central substrate area and the conductive pad. Metal plating may be used to deposit the stiffener ring. The stiffener ring may comprise one or more metal substances (e.g., copper, etc.). Two or more of the metal substances may be combined chemically and metallurgically as an alloy. The ring has sufficient stiffness and tensile and torsional strength to control or deter warping or flexing of the package assembly or its electronic components, which helps prevent damage during fabrication, installation and operation. A significant portion of the stiffener ring extends above the plane of the first surface of the substrate.

In step 45, an electrically insulating under-fill matrix material is disposed above the substrate upper surface and beneath at least the first electronic component. The under-fill matrix encapsulates the first set of interconnects. The matrix material may be deposited in a non-solidified state. Prior to a solidifying set-up of the under-fill matrix, the stiffener ring portion above the substrate surface dams a flow of the unsolidified under-fill material from an area of the first surface of the substrate in which the second set of interconnects is disposed. Thus, the stiffener ring deters contamination of the conductive pad area by misplaced under-fill material and related electrical conduction inadequacies.

In another example embodiment, the metallic stiffener ring is disposed about a periphery of the substrate. An example embodiment may be implemented in which substrate comprises a base, which is disposed over a second (e.g., lower) surface of the substrate opposite from the first (e.g., upper) surface thereof. The electronic package assembly may have a package on package (PoP) configuration. The PoP may be mounted on a printed circuit board (PCB) or the like or fastened thereto electromechanically. Some or all of the interconnects in the first and/or second array may be coupled electrically to conductors of the PCB, such as vertical interconnect accesses (vias) and traces for the exchange of data and signals.

An example embodiment of the present invention relates to stiffening an electronic package, such as a package assembly having a substrate. A first electronic package, having a first function, is electromechanically fastened to a first surface of the substrate with a first array of electrically conductive interconnects, which is disposed over a central area of the first surface of the substrate. A second electronic package, having a second function, is fastened to the first surface of the substrate with a second conductive interconnect array. At least a pair of the first array conductors is electrically coupled to at least a pair of the second array conductors for data and signal exchange and thus, at least a component of the first electronic package interacts with at least a component of the second package. A metallic stiffener ring is disposed about an outer periphery of at least the central area of the substrate.

Thus, an example embodiment of the present invention relates to stiffening an electronic package. An example embodiment maintains the flatness of a PoP electronic stack and its component packages during and following assembly, and thus prevents, deters or minimizes flexing and possible damage related thereto. While maintaining its flatness during assembly of the PoP, an example embodiment also prevents overflow of polymeric electrically insulating under-fill material from beneath an upper component package thereof and reduction in electrical effectiveness of its conductive interconnects related thereto. Further, an example embodiment thus stiffens electronic packages and assembles flat PoP products and component packages thereof without increasing the complexity, cost, or failure rate of their production.

Definitions that are expressly set forth in each or any claim specifically or by way of example herein, for terms contained in relation to features of such claims are intended to govern the meaning of such terms. Thus, no limitation, element, property, feature, advantage or attribute that is not expressly recited in a claim should limit the scope of such claim in any way. The specification and drawings are, accordingly, to be regarded in an illustrative rather than a restrictive sense.

Example embodiments of the present invention are thus described in relation to stiffening an electronic package. An example embodiment of the present invention is described above in relation to a PoP configuration with a metallic stiffener ring. In the foregoing specification, example embodiments of the present invention are described with reference to numerous specific details that may vary between implementations. Thus, the sole and exclusive indicator of that, which embodies the invention, and is intended by the Applicants to comprise an embodiment thereof, is the set of claims that issue from this application, in the specific form in which such claims issue, including any subsequent correction.

What is claimed is:

1. A method of packaging an assembly of electronic devices, the method comprising:
   fastening a first electronic package related to a first function electromechanically over a first surface of a substrate with a first array of electrically conductive interconnects, which is disposed over a central area of the first surface of a substrate;
   fastening a second electronic package related to a second function electromechanically over the first surface of a substrate with a second array of electrically conductive interconnects, wherein at least a pair of first conductors is electrically coupled to at least a pair of second conductors for the exchange of data or signals and wherein at least a component of the first electronic package interacts with at least a component of the second package; and
   depositing a metallic stiffener ring about an outer periphery of at least the central area of the substrate.

2. The method as recited in claim 1 wherein the substrate comprises an electrically insulating material.

3. The method as recited in claim 1 wherein the first function relates to a logic operation.

4. The method as recited in claim 3 wherein the at least a component of the first electronic package comprises a processor.

5. The method as recited in claim 1 wherein the second function relates to a memory operation.

6. The method as recited in claim 1 wherein the metallic stiffener ring comprises one or more of an alloy or a metal substance.

7. The method as recited in claim 6 wherein the metal substance comprises copper.

8. The method as recited in claim 1, further comprising, following the depositing the metal stiffener ring, disposing an electrically insulating under-fill matrix beneath at least the first component and above the substrate upper surface, wherein the under-fill matrix encapsulates the first set of interconnects, wherein a portion of the stiffener ring extends above the plane of the first surface of the substrate, and wherein the stiffening metallic ring dams a flow of an unsolidified portion of the under-fill matrix, prior to a solidification thereof, from an exclusionary area within the first surface of the substrate in which the second set of interconnects is disposed.

9. The electronic package assembly method as recited in claim 1 wherein the metallic ring is disposed about a periphery of the substrate.

10. A method of packaging an assembly of electronic devices, the method comprising:
    coupling a first electronic package electromechanically over a first surface of a substrate through a first array of conductive interconnects disposed in a central area of the first surface of the substrate;
    coupling a second electronic package over the first surface of the substrate with a second array of conductive interconnects, wherein at least a conductive interconnect in the first array is electrically coupled to at least a conductive interconnect in the second array, wherein at least a component of the first electronic package interacts with at least a component of the second electronic package;
    depositing a metallic stiffener ring about an outer periphery of the central area of the substrate; and
    disposing an electrically insulating under-fill matrix beneath the first electronic package and above the first surface of the substrate.

11. The method as recited in claim 10, wherein the first electronic package comprises a processor.

12. The method as recited in claim 10, wherein the second electronic package comprises a memory device.

13. The method as recited in claim 10, wherein the metallic stiffener ring comprises one or more of an alloy or a metal substance.

14. The method as recited in claim 13 wherein the metal substance comprises copper.

15. The method as recited in claim 10, wherein the under-fill matrix encapsulates the first array of conductive interconnects, wherein a portion of the metallic stiffener ring extends above the first surface of the substrate, and wherein the metallic stiffening ring is operable to dam a flow of an unsolidified portion of the under-fill matrix, prior to a solidification thereof, from an exclusionary area within the first surface of the substrate in which the second array of interconnects is disposed.

16. The electronic package assembly method as recited in claim 10 wherein the metallic stiffening ring is disposed about a periphery of the substrate.

17. The method as recited in claim 10, wherein the depositing the metallic stiffener ring is performed in a metal plating process.

18. An electronic package assembly, comprising:
    a substrate;
    a first electronic package related to a first function and electromechanically fastened to a first surface of the substrate with a first array of electrically conductive interconnects, which is disposed over a central area of the first surface of the substrate;
    a second electronic package related to a second function and electromechanically fastened to the first surface of the substrate with a second array of electrically conductive interconnects, wherein at least a pair of the first interconnects is electrically coupled to at least a pair of the second interconnects for the exchange of data or signals and wherein at least a component of the first electronic package is operable to interact with at least a component of the second package; and
    a metallic stiffener ring disposed about an outer periphery of at least the central area of the substrate.

19. The electronic package assembly as recited in claim 18 wherein the substrate comprises an electrically insulating material.

20. The electronic package assembly as recited in claim 18 wherein the first function relates to a logic operation.

21. The electronic package assembly as recited in claim 20 wherein the at least a component of the first electronic package comprises a processor.

22. The electronic package assembly as recited in claim 18 wherein the second function relates to a memory operation.

23. The electronic package assembly as recited in claim 18 wherein the metallic stiffener ring comprises one or more of an alloy or a metal substance.

24. The electronic package assembly as recited in claim 23 wherein the metal substance comprises copper.

25. The electronic package assembly as recited in claim 18, further comprising an electrically insulating under-fill matrix disposed above the substrate upper surface and beneath at least the first component, wherein the under-fill matrix encapsulates the first array of interconnects, wherein a portion of the stiffener ring extends above the plane of the first surface of the substrate, and wherein, prior to a solidifying set-up of the under-fill matrix, dams a flow of an unsolidified under-fill matrix from an area of the first surface of the substrate in which the second array of interconnects is disposed.

26. The electronic package assembly as recited in claim 18 wherein the metallic stiffener ring is disposed about a periphery of the substrate.

27. The electronic package assembly as recited in claim 18 wherein the first electronic package and the second electronic package comprise a package on package (PoP) configuration.

28. An electronic package product assembled by a process comprising:
fastening a first electronic package related to a first function electromechanically over a first surface of a substrate with a first plurality of interconnects, which is disposed over a central area of the first surface of the substrate;
fastening a second electronic package related to a second function electromechanically over the first surface of the substrate with a second array of electrically conductive interconnects, wherein at least a pair of first conductors is electrically coupled to at least a pair of second conductors for the exchange of data or signals and wherein at least a component of the first electronic package interacts with at least a component of the second package; and
depositing a metallic stiffener ring about an outer periphery of at least the central area of the substrate.

29. The electronic packaging product as recited in claim 28, the process further comprising:
following the depositing the metal stiffener ring, disposing an electrically insulating under-fill matrix beneath at least the first component and above the substrate upper surface, wherein the under-fill matrix encapsulates the first set of interconnects, wherein a portion of the stiffener ring extends above the plane of the first surface of the substrate, and wherein the stiffening metallic ring dams a flow of an unsolidified portion of the under-fill matrix, prior to a solidification thereof, from an exclusionary area within the first surface of the substrate in which the second set of interconnects is disposed.

30. The electronic packaging product as recited in claim 28, wherein the depositing a metallic stiffener ring comprises a metal plating process.

* * * * *